United States Patent [19]

Finley

[11] Patent Number: 4,658,213

[45] Date of Patent: Apr. 14, 1987

[54] METHOD AND APPARATUS FOR TESTING DIRECT CURRENT MOTORS AND GENERATORS, ELECTROMAGNETIC DEVICES, AND THE LIKE

[76] Inventor: Stanton M. Finley, 865 N. 2nd East, Price, Utah 84501

[21] Appl. No.: 671,926

[22] Filed: Nov. 16, 1984

[51] Int. Cl.⁴ .......................................... G01R 33/00
[52] U.S. Cl. .............................. 324/158 MG; 322/99
[58] Field of Search ................ 324/158 MG, 158 R; 323/255, 256, 340, 342, 343, 344; 363/126; 322/99; 318/490

[56] References Cited

U.S. PATENT DOCUMENTS

| | | | |
|---|---|---|---|
| 3,746,979 | 7/1973 | Kildishev et al. | 318/490 |
| 3,942,111 | 3/1976 | Pfouts | 324/158 MG |
| 4,070,624 | 1/1978 | Taylor | 322/99 |
| 4,138,642 | 2/1979 | Mohr | 324/158 MG |
| 4,303,878 | 12/1981 | Masutani | 322/99 |
| 4,441,076 | 4/1984 | Baum | 324/158 MG |
| 4,476,521 | 10/1984 | Kljucaricek | 323/344 |

FOREIGN PATENT DOCUMENTS 0773252  11/1955  United Kingdom ................ 363/126

OTHER PUBLICATIONS

"Bridge Center-Tap Rectifier Regulator", by Feth, IBM Tech. Dis. Bull., 9/73, vol. 16, #4, p. 1160.
"Grounding and Noise Reduction Practices for Instrumentation Systems", by Scientific Data Systems, Santa Monica, Ca., 1969.

Primary Examiner—Reinhard J. Eisenzopf
Assistant Examiner—William Burns
Attorney, Agent, or Firm—Thorpe, North & Western

[57] ABSTRACT

Method and apparatus for testing D.C. motors, D.C. generators, electromagnetic devices, and the like is disclosed. An electrical circuit produces a current limited, pulsating or otherwise time varying direct current signal which is applied to the device or component under test. The signal induces a return signal in the device or component under test, or in a magnetic sensor placed in proximity to the device or component under test. The return signal is amplified and displayed on an amplifier output display. Novel methods are disclosed which utilize the apparatus to (1) determine and set the neutral plane in a D.C. motor or commutator type generator, (2) locate grounded, shorted, open or crossed coils or bars in an armature of a D.C. motor or a D.C. generator, (3) determine the relative magnetic polarity of the windings of various electromagnetic devices, and (4) detect shorted, grounded, or faulty field windings of various electromagnetic devices, including field coil windings in D.C. motors and generators.

12 Claims, 4 Drawing Figures

METHOD AND APPARATUS FOR TESTING DIRECT CURRENT MOTORS AND GENERATORS, ELECTROMAGNETIC DEVICES, AND THE LIKE

BACKGROUND OF THE INVENTION

1. Field:

The present invention relates to methods and apparatus for testing electromagnetic apparatus and, in particular, for testing D.C. motors, D.C. generators and other apparatus utilizing electromagnetic windings.

2. State of the Art:

In the manufacture of as well as the repair of D.C. motors and generators it is necessary to determine the neutral point or neutral plane of the motor or generator. The neutral point or neutral plane of a D.C. motor or generator can be defined as a particular position in which the brushes are positioned relative to the field poles such that a minimum of sparking or arcing is produced at the commutator bars. At the neutral point or neutral plane, the armature coils, which are shorted by the brushes through the commutator, are positioned at or almost exactly between stator poles of opposite magnetic polarity. These armature coils cut relatively few lines of magnetic flux, and there is minimal current induced in the armature coils. Therefore, only minimal if any sparking occurs at the commutator when the armature coils are shorted together by the brushes.

Proper setting of the neutral plane is critical when manufacturing or repairing D.C. motors and generators inasmuch as abnormal sparking or arcing at the commutator causes undue, rapid deterioration of the commutator and brushes. Further, accurate setting of the neutral plane is vital to achieving optimum performance and efficiency from the motor or generator.

Prior art methods of setting the neutral plane in D.C. motors and generators are time consuming, and it is difficult to achieve any reasonable degree of accuracy. In one prior art method, the motor or generator is at least partially disassembled. One of the armature coils slots is marked, and the leads from this coil slot is traced to the commutator. This procedure is often complicated inasmuch as the coil slots are often rather inaccessible. After having marked one of the armature coil slots and tracing the leads therefrom to the commutator, the armature is turned so that the marked slot is positioned directly beneath the interpole. The brush holder is then moved to a position in which one brush is over the commutator bars connected to the marked coil. This procedure is time consuming and thus economically inefficient.

A second prior art method that has been utilized for setting the neutral plane of a D.C. motor involves repetitive operation of the motor in both directions under load. The brush holder is adjusted between each set of runs, with the object being to achieve a proper neutral plane setting in which the motor operates at the same speed in both directions. Although this procedure does not require extensive disassembly of the motor, the procedure is excessively time consuming and again economically inefficient.

A third prior art method of setting the neutral plane involves applying a normal current in the armature-interpole circuit without any field current. The brush holder is adjusted in successive tests to achieve a neutral plane setting in which the armature will not turn when the armature-interpole current is applied. This procedure is time consuming and as well involves a rather high degree of danger even when carefully performed by a skilled operator.

Another problem inherent in testing and checking D.C. motors and generators is encountered in determining and locating common armature faults such as grounded, shorted, faulty or incorrectly connected coils or bars in the armature assembly. The faulty coils or bars are difficult to isolate because any of the numerous bars or coils have electrical continuity with the other bars or coils in the assembled armature. The armature faults, unless isolated and corrected, will cause commutator arcing, poor equipment performance, or complete failure of the equipment. Prior art methods of locating such armature faults are described in "Electric Motor Repairs" by Robert Rosenberg which was published by Holt, Pinehart, and Winston. These methods are very time consuming and the results are often ambiguous.

In manufacturing or repairing D.C. motors and generators, the relative magnetic polarity of the poles in the apparatus must be determined in order to establish the correct rotational direction as well as to facilitate connection to the armature so that when the direction of rotation is selected, the interpoles augment (boost) the action of the main field rather than impede (buck) the main fields when the apparatus is operating. Failure to correctly connect the armature circuit at the brush holder or rack will result in extremely inefficient operation or total failure of the apparatus. Prior art methods for determining relative magnetic polarity involve the use of a magnetic compass. Such methods often produce ambiguous results because the compass needle can be deflected under the influence of an adjacent pole when all fields are energized.

Another problem encountered in checking or repairing D.C. motors and generators is to detect shorted or grounded field windings. The detection of shorted or grounded field windings is difficult, especially with series windings, because of the extremely low resistances of the windings. Prior art methods for detecting shorted or grounded field windings involve the use of a low resistance measuring device such as a wheatstone bridge or the use of a voltmeter to detect relative voltage drops across the windings. These methods are inconvenient because stripping or puncturing the insulation around the winding connections is required to perform the test procedures.

3. Objectives:

A principal objective of the present invention is to provide improved apparatus and methods for analyzing various parameters of D.C. motors and generators. A particular objective of the present invention is to provide improved apparatus and method for rapidly, accurately and safely determining the position of the neutral plane in D.C. motors and commutator type generators. An additional objective is to provide improved apparatus and method for locating and isolating grounded, shorted, faulty, open or crossed coils or bars in a D.C. armature. A further objective is to provide improved apparatus and method for determining the relative magnetic polarity of the windings of various electromagnetic devices, including the field windings in D.C. motors, and generators. A still further objective is to provide improved apparatus and method for detecting shorted, grounded or defective windings of various electromagnetic devices, including field coil windings in D.C. motors and generators.

SUMMARY OF THE INVENTION

The above objectives are achieved in accordance with the present invention by providing improved electronic testing apparatus and methods of using the apparatus to determine various parameters in electromagnetic devices, including D.C. motors and generators. The apparatus comprises a first electrical circuitry which is adapted to produce a pulsating or otherwise time varying direct current output. Preferably, the first circuitry is provided with current regulating means to control the output current developed by the first circuitry irrespective of external resistance to which the output current may be applied or to voltage fluctuations and the like supplied to the first circuitry.

The output signal from the first circuitry is adapted to be applied to the electromagnetic device under test. The output signal from the first circuitry interacts with the electromagnetic device under test, and a return signal is induced by such interaction. The return signal is induced either in the device under test or in a magnetic sensor placed in proximity to the device under test. In the latter instance, the magnetic sensor is adapted to respond to magnetic phenomena generated by the interaction between the output signal from the first circuitry and the device under test, and the magnetic sensor generates a return signal. In either situation, i.e., whether the return signal is induced in the device under test or in a magnetic sensor, the return signal is representative of a parameter of the electromagnetic device which is being tested.

The return signal is applied through appropriate leads to a second electrical circuit which is adapted to amplify the return signal. The amplified return signal is then monitored by a third electrical circuit, with the third electrical circuit being adapted to indicate the magnitude of the amplified return signal. The second electrical circuit comprises an amplifier and further includes a regulated power supply for providing power to the amplifier and a gain control means for adjusting the gain of the amplifier. Appropriate means are provided, of course, for transmitting the output current from the first circuit to the device under test and for transmitting the return signal from either the device under test or the associated magnetic sensor to the second electrical circuit.

The apparatus of the present invention thus comprises a combination of a precision source of pulsating D.C. output current, means for applying the output current to the electromagnetic device under test to produce a return signal to the amplifying circuitry and means for monitoring and indicating the magnitude of the amplified return signal. The novel testing apparatus is capable of testing numerous parameters and functions of various electromagnetic devices. The apparatus of the present invention is particularly adapted to be used in testing D.C. motors and generators. Novel methods of using the apparatus are disclosed and will be more fully described hereinafter for setting the neutral plane in a D.C. motor or generator, for locating and isolating grounded, shorted, open or crossed coils or bars in the armature of a D.C. motor or generator, for determining the relative magnetic polarity of windings in an electromagnetic device such as a D.C. motor or generator, and for detecting shorted, grounded or defective windings in an electromagnetic device such as a D.C. motor or generator.

Additional objects, features and advantages of the present invention will become apparent from a consideration of the following detailed description and the accompanying drawings:

BRIEF DESCRIPTION OF THE DRAWINGS

Preferred embodiments of the present invention which illustrate the best mode presently contemplated of carrying out the invention are illustrated in the drawings, in which.

DETAILED DESCRIPTION OF THE PREFERRED EMBODIMENTS

Figure 1:
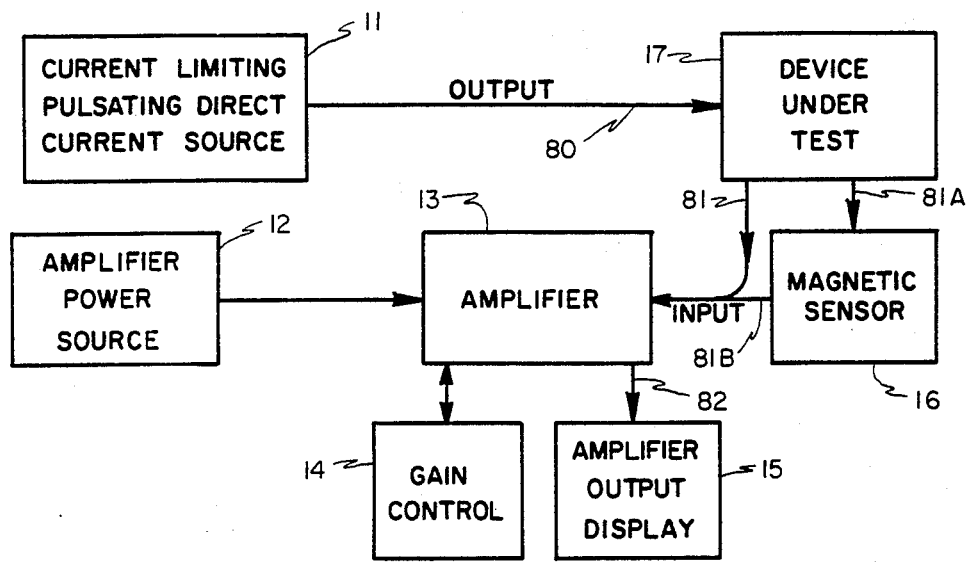
FIG. 1 is a block, schematic diagram of a preferred embodiment of apparatus in accordance with the invention.
Figure 2:
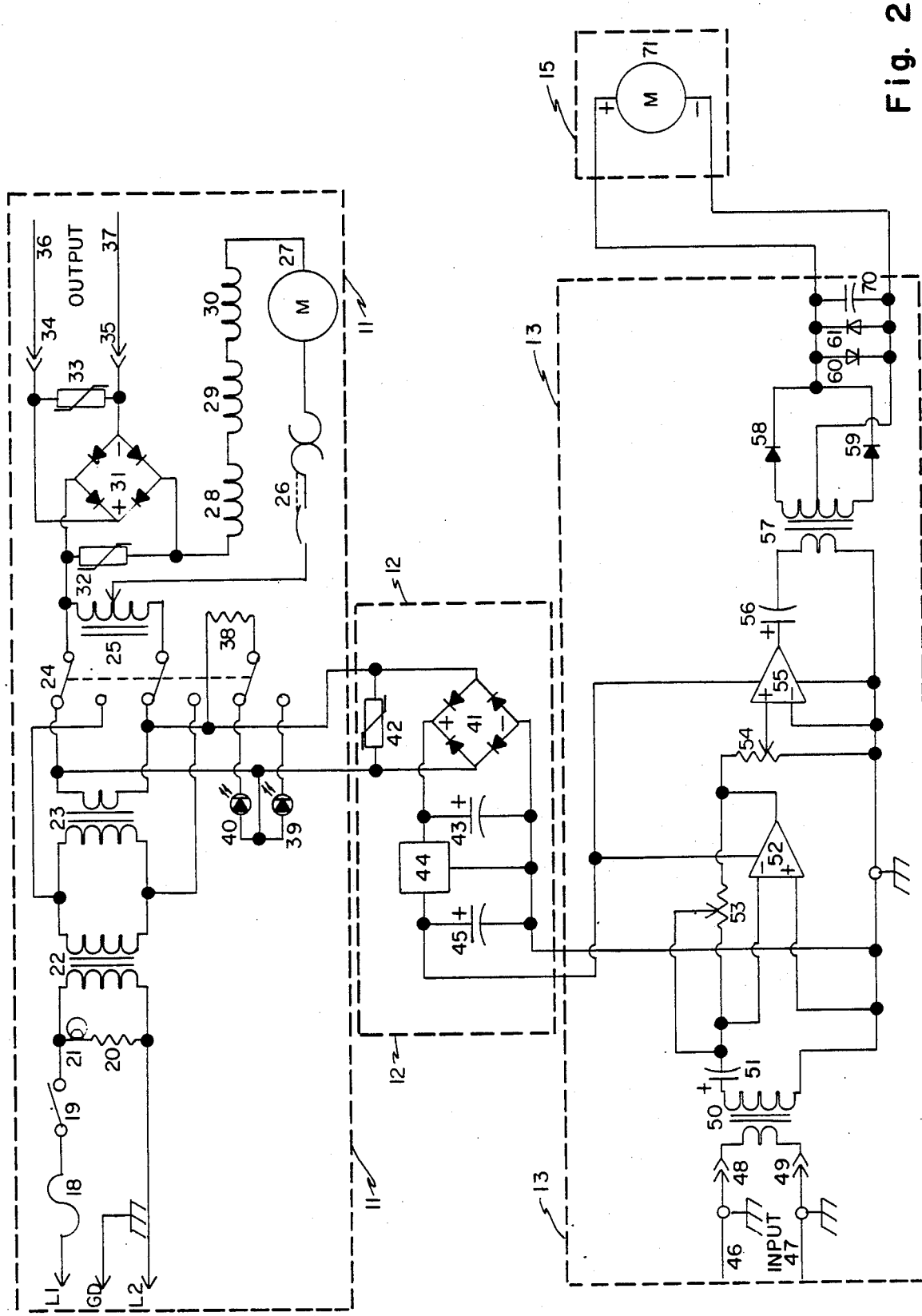
FIG. 2 is a schematic circuit diagram of one preferred embodiment of the apparatus in accordance with the invention.

Referring to the drawings, there is shown schematically in FIGS. 1 and 2 one preferred embodiment of testing apparatus in accordance with the present invention which is suitable for testing D.C. motors, commutator type D.C. generators, electromagnetic devices and the like. As illustrated in general block form in FIG. 1, the apparatus comprises a current generator 11. As will be more fully discussed hereinafter, the generator 11 is adapted to produce a precision output signal 80 consisting of pulsating direct current. The output signal 80 is current limited, such that the current of the output signal 80 will be maintained within a given set of limits irrespective of line voltage fluctuations which may occur in the power source for the generator 11 or of varying resistance to which the output current 80 may be applied.

The output current 80 is applied to the device or component 17 which is to be tested. The output current 80 induces a return signal 81 within the device 17 under test. Depending upon the particular parameter or function of the device 17 which is to be measured, the return signal 81 can be monitored directly from the device 17 or from a magnetic sensor 16 which is placed in proximity to the device 17 under test. As shown schematically in FIG. 1, the output signal 81 can be monitored directly from the device 17 under test and transmitted to an amplifier 13. If the output signal 81 produced by the device under test is of the type which is best monitored by a magnetic sensor 16, a secondary return signal 81b is generated in the magnetic sensor 16 in response to the primary return signal 81a developed in the device 17 under test, and the secondary return signal 81b is transmitted to the amplifier 13. Both the directly monitored return signal 81 and the indirectly monitored return signal 81b are shown in FIG. 1. The return signals 81 and 81b will not be transmitted concurrently to the amplifier 13. One or the other of the return signals will be utilized depending upon the particular test which is to be performed on the device 17 under test. The amplifier 13 is powered from a power source 12. The amplifier is also provided with a gain control 14 which adjusts the gain of the amplifier 13. The return signal 81 or 81b is amplified by the amplifier 13, and the amplified signal 82, which is proportional to the return signal 81 or 81b, is transmitted to an output display which gives an analog reading of the magnitude of the output, amplified signal 82.

A detailed schematic diagram of a preferred embodiment of the invention is shown in FIG. 2. The apparatus shown schematically in FIG. 2 corresponds to the apparatus of FIG. 1, and like parts will be identified with the same reference numerals. The current limiting source 11 of pulsating D.C. current of FIG. 1 is shown encircled by broken line 11 in FIG. 2. Power is provided to the current source 11 through a suitable cord and three prong plug which is adapted to be connected to a standard 110 volt, 60 cycle alternating current supply through a grounded receptacle. The prongs of the three prong plug are shown as L1, L2 and GD in FIG. 2. The receptacle on the 110 volt supply line is not shown in the drawings.

The ground plug of the three prong plug is shown as GD and the ground plug is adapted to ground the apparatus. The line voltage is supplied through the prongs L1 and L2 to the primary winding of a 60 VA constant voltage transformer 22 through a 1 amp ground fault and short circuit protective fuse 18. An illuminated switch is advantageously provided comprising switch contacts 19 in series between one prong L1 and the transformer 22. A dropping resistor 20 and a neon lamp 21 are wired in series with one another so as to shunt the transformer 22. When the contacts 19 of the switch are open, power to the apparatus is broken, and the neon lamp 21 will not be illuminated. When the contacts 19 of the switch are closed, power is connected to the apparatus through transformer 22, and the neon lamp 21 will be illuminated.

The constant voltage transformer 22 is adapted to maintain a substantially stable output current from its secondary winding over a wide range of line voltage fluctuations. The output from the secondary winding of the constant voltage transformer 22 is connected to the primary winding of a dropping transformer 23 which is adapted to produce a nominal 16 volt output from its secondary winding. The transformer 23 preferably has an output current rating of about 3 amperes. The output from the secondary winding of the constant voltage transformer 22 is further connected to a pair of respective contacts on a three pole, double throw switch 24. The ouput from the secondary winding of the dropping transformer 23 is connected to the other mutually respective contacts associated with the pair of contacts which are connected to the output from the secondary windings of the constant voltage transformer 22. The common terminals of the double throw poles which are associated with the above mentioned pair of contacts of switch 24 are connected to a variable autotransformer 25. Thus, the switch 24 provides means of applying either a nominal 16 volt potential or a nominal 120 volt potential to the autotransformer 25 depending upon the two alternate positions of the double throw poles. The choice of a high or low voltage from the switch 24 in combination with the variable autotransformer 25 provides a means of achieving a wide range of voltage values from the output of the autotransformer 25. This in turn allows application of a wide range of voltage values to a load which is connected to the autotransformer 25 through the output thereof as will be explained hereinafter.

Circuitry is advantageously provided to indicate whether the low voltage or high voltage input is connected to the autotransformer 25. In one preferred embodiment of such circuitry, one leg of the 16 volt secondary winding of the dropping transformer 23 is connected to the common terminal of the third pole of switch 24 through a 1000 ohm dropping resistor 38. Two light emitting diodes 39 and 40 are connected in parallel between the two contacts associated with the third pole of switch 24 and the other leg of the 16 volt secondary winding of the dropping transformer 23. The third pole of switch 24 thus serves to switch a low voltage potential to one or the other of the light emitting diodes 39 and 40 depending upon the position of switch 24. As illustrated, when the switch 24 is thrown so as to connect the nominal 16 volt potential to the autotransformer 24, the light emitting diode 40 will be illuminated. Thus, the illumination of diode 40 is indicative of low level voltage output from the autotransformer 25. When the switch 24 is thrown so as to connect the nominal 120 voltage potential to the autotransformer 25, the light emitting diode 39 will be illuminated. Thus, the illumination of diode 39 is indicative of high level voltage output from the autotransformer 25. The diodes 39 and 40 are advantageously located on the face plate of the apparatus along with the controls for the switch 24 and the autotransformer 25. The control for the switch 24 is labeled "Voltage Select" on the face plate of the apparatus. The diode 39 is preferably made to emit red light, and it is labeled "Caution-High". The diode 40 is preferably made to emit green light, and it is labeled "Low". The operator of the apparatus is thereby usually made aware of whether the voltage potential to the output of the autotransformer 25 is low or high.

The output of the variable autotransformer 25 is applied to the A.C. terminals of a full wave bridge rectifier 31. Preferably, the rectifier 31 is of the type comprising four diodes, with the rectifier having a capacity of 25 amps and a peak inverse voltage rating of 200. Such a rectifier exhibits good thermal inertia and thus aids in maintaining the output current therefrom at a stable value. One leg of the connection between the autotransformer 25 and the rectifier 31 contains in series a 1.75 ampere circuit breaker 26, an ammeter 27, and three 1.2 millihenry, 80 watt inductor coils 28, 29 and 30. The circuit breaker 26 protects the autotransformer 25 and transformers 22 and 23 from overload. The circuit breaker 26 has a face panel reset button to reset the breaker. The ammeter 27 monitors the output current from the autotransformer 25. The three choke coils 28, 29 and 30 serve as current limiting devices by virtue of their inductive reactance. The choke coils act to limit the current through the output circuit even when the load connected to the output circuit is very low (as it is in many series wound D.C. motor stators).

A metal oxide varistor 32 is connected across the A.C. terminals of the rectifier 31 to protect the rectifier from damage due to line transients. A metal oxide varistor 33 is connected across the D.C. terminals of the rectifier 31 to protect the rectifier from possible high voltage pulses inductively generated if the output from the rectifier 31 is inadvertently disconnected from a high-inductance load. Output leads 36 and 37 are connected to the output from the rectifier 31 through banana jacks and plugs 34 and 35 in the front or face panel of the apparatus. The combined leads 36 and 37 are shown in FIG. 1 as the output 80 from the direct current source 11 to the device 17 under test. The opposite ends of the leads 37 and 38 are advantageously provided with clip means such as alligator clips to connect the leads to appropriate connections on the device under test.

The amplifier power source 12 of FIG. 1 is shown encircled in the broken line 12 in FIG. 2. The A.C. terminals of a full wave bridge rectifier 41 are connected across the 16 volt secondary winding of transformer 23. The rectifier 41 is preferably made of four diodes and has a peak inverse voltage rating of 50. A metal oxide varistor 42 is connected across the A.C. terminals of the rectifier 41 to protect the rectifier from line transients. A 470 microfarad capacitor 43 is connected across the D.C. terminals of rectifier 41. The capacitor 43 acts as a smoothing filter for the pulsating D.C. voltage from rectifier 41. The output voltage of rectifier 41 is further regulated by a 12 volt voltage regulator 44 which is connected conventionally with its center lead to ground. A 0.1 microfarad capacitor 45 is connected between the positive output of regulator 44 and ground. The capacitor 45 filters noise transients produced by the regulator 41 and bypasses radio frequency noise to ground. The amplifier power source 12 produces a well regulated, low ripple, 12 volt D.C. supply for the amplifier circuit 13.

The amplifier circuit 13 of FIG. 1 is shown encircled in the broken line 13 in FIG. 2. The input leads 46 and 47 are shielded and plug into shielded jacks 48 and 49. The shields are grounded to absorb electromagnetic and radio frequency interference which may otherwise enter the amplifier circuit 13. The grounded chassis serves as a shield for the amplifier circuit proper. The amplifier circuit is preferably contained in a small steel box inside the main chassis to shield the amplifier circuit from magnetic fields generated by transformers 22, 23 and 25 and by inductor coils 28, 29 and 30. The input leads 46 and 47 come from either the device 17 under test or from a magnetic sensor 16. When the input leads 46 and 47 come directly from appropriate contacts on the device 17 under test, the combined leads are shown in FIG. 1 as input 81 from the device 17 under test to the amplifier 31. When the leads 46 and 47 come from a magnetic sensor 16 which is used in conjunction with the device 17 under test, the combined leads are shown in FIG. 1 as input 81b from the magnetic sensor 16 to the amplifier 31.

The input leads 46 and 47 are connected to an 8 ohm winding of an 8 ohm to 1000 ohm miniature transformer 50. This serves to couple the low input impedance of the input circuit to the higher impedance of the amplifier circuit and to isolate the grounded amplifier circuit from the input. One leg of the 1000 ohm winding of transformer 50 is connected to ground to complete a return path for the signal through a 741 operational amplifier 52. The other leg of the 1000 ohm winding of transformer 50 is connected to a 1 microfarad capacitor 51 which serves as a D.C. blocking capacitor while allowing the input signal to be applied to the inverting input of operational amplifier 52. Feedback from the output of the operational amplifier 52 is returned to the inverting input through a 1 million ohm linear taper potentiometer 53. The feedback through potentiometer 53 controls the effective gain of the operational amplifier 52. This potentiometer 53, together with its calibrated knob, constitutes the gain control 14 of FIG. 1.

A portion of the output of operational amplifer 52 is applied through a 10,000 ohm trimmer potentiometer 54 to the non-inverting input of an LM386 amplifier 55. The potentiometer 54 functions as a trimmer resistor to adjust the amplifier gain in case the amplifier cannot achieve sufficiently low gain for some applications by using the gain control 14 alone. The output signal from the amplifier 55 is fed through a 100 microfarad blocking capacitor 56 and through an 8 ohm winding of an 8 ohm to 1000 ohm miniature transformer 57 to ground. This completes the signal path through the amplifier 55. The transformer 57 couples the low impedance output of amplifier 55 to the higher impedance of the amplifier output display circuit 15 (shown in FIG. 1 and within the broken line 15 of FIG. 2).

The center tapped 1000 ohm winding of transformer 57 is connected to two 1N4005diodes 58 and 59 in a conventional full wave rectifier configuration with the center tap as the negative terminal. Two additional 1N4005 diodes 60 and 61 are connected across negative and positive outputs of the bridge configuration comprising the transformer 57 and diodes 58 and 59. The diodes 60 and 61 act as meter movement protection for a 0 to 50 microammeter 71 which is connected in parallel with the diodes 60 and 61. The diodes 60 and 61 will not conduct current until the voltage across them is at least from about 0.5 to 0.7 volts. This range of voltage causes full scale deflection of the ammeter 71. Thus, the diodes 60 and 61 remain nonconducting and allow normal operation over the operating range of the ammeter 71. The diodes 60 and 61 protect the ammeter 71 from excessive voltage by shunting current through the diodes when the diodes are activated to their conducting state by an excessive voltage. A 10 microfarad capacitor 70 also shunts the ammeter 71. The capacitor 70 acts as a smoothing filter for the input to the ammeter 71. The ammeter 71 constitutes the amplifier output display 15 of FIG. 1 and is accordingly shown encircled in FIG. 2 by the broken line 15.

The operation of the apparatus of FIG. 1 and 2 in testing various parameters of electromagnetic devices will now be explained. The apparatus is ideally suited for use in a new and novel method of very accurately and efficiently determining and setting the neutral plane of a commutator type rotating D.C. device, such as a generator or motor. The output leads 36 and 37 of FIG. 2 (shown as the combined output signal 80 of FIG. 1) are connected across the field circuit of the D.C. device. The leads 46 and 47 of FIG. 2 (shown as the combined input signal 81 of FIG. 1) are connected across the armature-interpole circuit of the D.C. device.

The gain control 14 of FIG. 1, consisting of the potentiometer 53 of FIG. 2, is set such that a display reading is observed on the amplifier output display 15, which consists of the ammeter 71 of FIG. 2. The brush rack or rigging of the D.C. device under test is slowly rotated such that maximum and minimum readings are observed on the display 15, i.e., the ammeter 71. This is a static test, i.e., the D.C. device such as a motor or generator is not running during the test. The neutral point is determined and set when the display 15 is at a minimum reading, with the brush rigging or rack being fixed and set at this point.

The testing for the neutral plane involves the principle of applying a pulsating or otherwise time varying, direct current output signal (the r.m.s. or the average of which is fixed or controllable, but remains at a precise selected value irrespective of power supply voltage fluctuations and the like) across the field windings of a D.C. device such as a motor or commutator type generator. A return signal is induced in the armature of the D.C. device by the pulsating signal applied to the field windings. The return signal is amplified, and the amplified signal is applied to an output display means. At the neutral point, the armature coils shorted by the brushes in the brush rigging or rack of the D.C. device cut relatively few lines of magnetic flux inasmuch as the armature coils are positioned between main stator poles of opposite magnetic polarity, where the configuration of magnetic lines of flux through the magnetic cirucit in the D.C. device imposes minimum flux density on the armature coils. Thus, the return signal induced in the armature of the D.C. device will be minimal at the neutral point because of minimum inductance in the armature at the neutral point. By rotating the brush rigging or rack of the D.C. device under test to a position in which the return signal is a minimum, the neutral point is established, and the brush rigging or rack can be fixed or secured in this position, i.e., the neutral point position. By amplifying the return signal using a high gain amplifier, the neutral point can be set with extreme accuracy.

Figure 3:
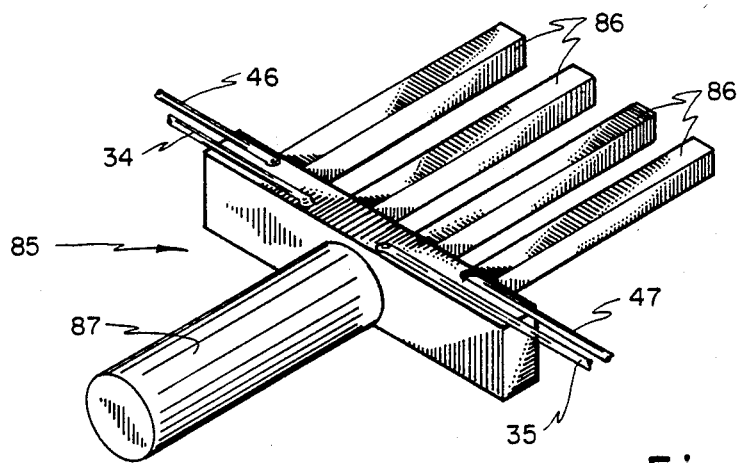
FIG. 3 is a pictorial view of a test probe which is used with the apparatus of FIG. 1 in locating shorted, open or cross coils or commutator segments in a D.C. armature.

The apparatus of FIGS. 1 and 2 can also be used in a new and novel method of locating grounded, shorted, faulty, open or crossed coils or bars in an armature of a D.C. device such as a motor or generator. For this test, a simple test probe is required in addition to the apparatus of FIGS. 1 and 2. The test probe 85 is shown in FIG. 3. The test probe comprises four flexible, moveable conductive fingers 86 mounted on a suitable insulating handle 87. The two outside fingers 86 of probe 85 are connected to mutually respective leads. These leads correspond to the output leads 34 and 35 of FIG. 2, and, thus, the leads are identified by the numerals 34 and 35 in FIG. 3. The two inside fingers 86 of probe 85 are connected to second mutually respective leads. These second leads correspond to the input leads 46 and 47 of FIG. 2, and, thus, these second leads are identified by the numerals 46 and 47 in FIG. 3.

The spacing of the fingers 86 is adjusted so that the two inside fingers will touch two adjacent commutator bars or segments, and the two outside fingers are spaced a distance of one or two bars from the respective inside fingers. The probe 85 is pushed down on the commutator so that contact is made by all the fingers 86 on their respective bars, i.e., with the two inside fingers contacting side-by-side, adjacent commutator bars and the two outside fingers contacting mutually respective bars positioned on opposite sides of the first two side-by-side adjacent bars. The gain control 14 is set so that the display reading of the output display 15 is approximately half scale. The probe 85 is then moved around the commutator from bar to bar, with the display readings of the output display 15 being observed for every setting of the probe 85. Faulty armature conditions will be indicated if the display reading varies significantly from the original reading.

The testing for faulty, grounded, shorted, open or crossed coils or bars in the armature involves the principle of applying a pulsating or otherwise time varying, direct current, output signal (the r.m.s. or the average of which is fixed or controllable, but remains at a precise selected value irrespective of power supply voltage fluctuations and the like) across the outside fingers of a four finger test probe 85. The two outside fingers contact mutually respective commutator bars or segments which are separated by at least two intermediate, side-by-side adjacent bars or segments. The output signal from the outside fingers of the probe 85 flows through the armature bars and coils, and a voltage drop occurs across each coil inasmuch as each coil in the armature exhibits an impedance consisting of its ohmic resistance and its inductive reactance to the pulsating D.C. output signal. The voltage across the respective coils defined by the outer commutator bars and the inner commutator bars forms a return signal which will be proportional to the input signal produced in the armature and fed to the input leads 46 and 47. The return signal is picked up from the two inner fingers on the probe 85, and the return signal is then amplified. The amplified return signal is displayed on the output display 15. Since all the coils in the armature are similar, the display reading on the output display 15 should be similar as the probe 85 is moved sequentially around the commutator unless a fault is present with respect to the coils connected to the commutator bars which contact the inner fingers of the probe 85 in any one of its positions. For example, if a coil connected to the two bars in contact with the two inside fingers of the probe 85 is short circuited or if the bars themselves are short circuited, there will be little or no voltage drop across that coil, and the return signal will be at or near zero. Similarly, if the two inside fingers of the probe 85 touch commutator bars associated with a coil that is open circuited, there will be no voltage drop across that coil, and the display reading on the output display 15 will be at or near zero. An unusually high resistance connection between a coil and a commutator bar will produce a high display reading on the output display 15. Crossed coil leads on the commutator will produce a twice normal display reading on the output display 15 inasmuch as crossing of coil leads results in two coils being connected in series between adjacent bars which causes a twice normal voltage drop.

A grounded armature coil can be located by removing one input lead from one of the two inside fingers of the probe 85 and attaching it to the core or shaft of the armature. As the probe 85 is moved around the armature from bar to bar, the display reading on output display 15 will become lower and lower as the grounded bar or coils is approached by the other inside finger of the probe 85. When the other inside finger of the probe 85 contacts the bar connected to the grounded coil, a zero or near zero display reading will be observed on the output display 15 inasmuch as there will be little or no voltage drop between the grounded coil and ground.

The apparatus of FIGS. 1 and 2 can further be used in a new and novel method of determining the relative magnetic polarity of field windings in D.C. motors and generators, as well as the windings of other electromagnetic devices. For this test windings of the electromagnetic device are connected together such that the direction of current flow through each of the windings is in the same direction as the current flow therein when the device is being utilized in its intended use. When the device being tested is a D.C. motor or generator, the main field and interpole circuits in an open stator are connected together such that the direction of current flow through each of the circuits is the same as the current direction when the motor or generator is in actual use.

Figure 4:
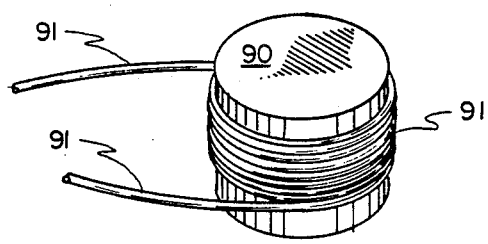
FIG. 4 is a pictorial view of a magnetic sensor which is used with the apparatus of FIG. 1 in determining the relative magnetic polarity of windings in an electromagnetic device and/or in detecting shorted, grounded or defective windings in an electromagnetic device.

The output leads 36 and 37 of FIG. 2 (shown) as the combined output signal 80 of FIG. 1 are connected across the interconnected windings of the device under test. The input leads 46 and 47 of FIG. 2 (shown as the combined input signal 81b of FIG. 1) are connected to a magnetic sensor 16 which is placed across pole pieces of the motor or generator or between the connected pair of windings in other electromagnetic devices. The magnetic sensor 16 is placed such that its axis is approximately perpendicular to the pole pieces of the motor or generator or to the axial planes of the connected pair of windings in other electromagnetic devices. The magnetic sensor 16 should also be approximately centered between the pole pieces or the pair of windings. The magnetic sensor 16 may be any small magnetic core 90 on which a few turns of insulated wire 91 have been wound as shown in FIG. 4. The magnetic sensor 16 can further be a Hall effect device or similar electronic magnetic flux sensor which produces an output signal which is proportional to magentic flux density.

This test involves the principle of applying a pulsating or otherwise time varying, direct current, output signal (the r.m.s. or the average of which is fixed or controllable but remains at a precise selected value irrespective of power supply voltage fluctuations and the like) across the interconnected windings of the device under test. Poles of opposite magnetic polarity will have linked lines of magnetic flux between them which produces a relatively high flux density in the magnetic sensor 16 so as to generate a relatively high induced voltage. Conversely, poles of the same magnetic polarity will have opposing lines of magnetic flux which produces a relatively low flux density in the magnetic sensor 16 so as to produce a relatively low induced voltage. The gain 14 of the testing apparatus is adjusted to produce a display reading from the output display 15. The windings are then tested as described above. Poles of the same magnetic polarity will give a low display reading, and poles of opposite magnetic polarity will give a high display reading.

The apparatus of FIGS. 1 and 2 can further be used in a new and novel method of detecting shorted, grounded or defective windings in electromagnetic devices, including D.C. motors and generators. The output leads 36 and 37 of FIG. 2 (shown as the combined output signal 80 of FIG. 1) are connected across a circuit containing the windings which are to be tested. The windings in this circuit may be connected in either series or parallel. The windings should be similar to each other and should be oriented alike with respect to each other. In addition, the windings should be spaced from each other by like distances. The input leads 46 and 47 of FIG. 2 (shown as the combined input signal 81b of FIG. 1) are connected to a magnetic sensor 16 such as was described hereinbefore.

The magnetic sensor 16 is placed on the pole of each winding in succession with the axis of the sensor 16 being aligned with the axial plane of the pole or the winding under test. The sensor 16 should be positioned in the same relative position with each pole or winding. As the magnetic sensor 16 is moved from winding to winding, the output leads 36 and 37 should be interchanged successively. This ensures that the magnetic polarity of each of the windings being tested will be the same with respect to the magnetic sensor 16. The gain 14 of the test apparatus is adjusted so that a display reading is observed from the output display 15. Each of the windings of the device are tested, and those windings which are not shorted, grounded, or otherwise defective will exhibit the same general display reading on the output display 15. Any winding which is shorted, grounded or defective will exhibit a display reading which is lower than the reading for the normal windings.

This test involves the principle of applying a pulsating or otherwise time varying, direct current, output signal (the r.m.s. or the average of which is fixed or controllable but remains at a precise selected value irrespective of power supply voltage fluctuations and the like) across the windings which are to be tested. The current introduced into the windings by the output signal generates a particular magnetic flux in each winding. The magnetic flux is proportional to the number of turns in the winding under test. All the windings should be of the same type having roughly the same number of turns. Thus all normal windings in the device under test should produce roughly the same magnetic flux. The magnetic sensor 16 monitors the magnetic flux, and will produce a generally constant return signal for the normal windings in the device. A shorted or grounded winding has, in effect, a reduction in the number of effective turns. Thus the defective winding will produce less magnetic flux, and the return signal from the magentic sensor 16 will be reduced. Thus, if the amplifier output display 15 reads significantly lower than the normal windings in the device under test, the particular winding producing that display reading is defective.

The flux density across the face of an electromagnetic pole piece may vary from point to point on the pole piece due to variations in the magnetic properties of the core material from point to point on the core face. The area of the magnetic sensor 16 should therefore, for this test, be substantially equal to the area of the core face under test. This will assure that the total flux is being measured and not just the flux at a particular point of the core face in question. The magnetic polarity of each winding being measured in succession should preferably be the same. This can be achieved by simply interchanging the output leads 36 and 37 after testing each successive winding. This assures that the input waveform from the magnetic sensor 16 will be the same for each winding under test. Otherwise, the amplifier 13 may distort an inverted waveform to a different degree, and thus, give a misleading reading. This test can be used on the winding of any electromagnetic device to compare the flux strength of the winding under test to a similar winding or to a standard winding.

Although alluded to previously, it should be noted that the combination of the switch 24 and the autotransformer 25 in the current source 11 are adapted to provide a wide range of output voltage to the output leads 36 and 37. When testing devices having low internal resistance, the switch 24 will normally be in the low position. When testing devices having high internal resistance and reactance, the switch 24 may need to be in the high position to produce an ouput reading in the output display. Thus the switch 24 and autotransformer 25 are manipulated in combination with the gain control 14 to produce a reading on the output display 15.

While particular embodiments of the invention have been illustrated and described, it is to be noted that various additions, changes and omissions may be possible without departing from the scope of the inventionn as set forth in the following claims.

I claim:

1. Apparatus for testing electromagnetic devices such as D.C. motors, D.C. generators, and other electromagnetic devices comprising:

means for producing a pulsating or otherwise time varying direct current output signal;

means for connecting the output signal to the device under test;

means for receiving a return signal from the device under test;

means for amplifying said return signal, producing an amplified signal; and means for displaying the magnitude of said amplified signal; wherein the means for producing said output signal comprises:

a constant voltage transformer;

means for connecting the constant voltage transformer to an electrical power supply;

a stepdown transformer connected in series with the constant voltage transformer;

2. Apparatus in accordance with claim 1, wherein means are further provided for varying the voltage of the output signal over a wide range, and the means for amplifying said return signal comprises an amplifier having a gain control means for controlling the gain of the amplifier.

switching means comprising at least two (2) double throw poles, with the poles being adapted to be switched between a relatively high voltage from the constant voltage transformer and a relatively lower voltage from the stepdown transformer;

an autotransformer connected to the two poles of said switching means;

a full wave bridge rectifier and at least one current limiting inductor coil connected in series between output terminals of said autotransformer;

wherein said output signal is produced by the bridge rectifier and comprises a pulsating D.C. signal, the r.m.s. value of which is controllable, but which remains stable irrespective of power supply voltage fluctuations.

3. Apparatus in accordance with claim 1, wherein the means for connecting the constant voltage transformer to an electrical power supply comprises first and second electrical leads adapted to be connected between the constant voltage transformer and a source of A.C. potential;

a current limiting breaker or fuse and a single pole, single throw switch connected in series in one of said first and second electrical leads; and an illuminating means connected between said first and second electrical leads, so that said illuminating means will generate visible light when the single pole, single throw switch is closed.

4. Apparatus in accordance with claim 3, wherein an indicator lamp circuit means is provided in combination with said switching means, with said indicator lamp circuit means being adapted to give first and second visible signals for the high voltage and low voltage positions, respectively, of said switching means.

5. Apparatus in accordance with claim 1, wherein an ammeter is provided in combination with the full wave bridge rectifier to indicate the current of said output signal, and a metal oxide varistor is connected between the A.C. input of the full wave bridge rectifier as a transient protector for the rectifier.

6. Apparatus in accordance with claim 1, wherein the means for connecting the output signal to the device under test comprises a pair of insulated, flexible wire leads which are adapted to be connected at mutually respective one ends to the means for producing the output signal and which also have means at the other ends for being connected to the device under test.

7. Apparatus in accordance with claim 1, wherein the means for producing the output signal and the means for amplifying the return signal are housed within a metal chassis, and the means for receiving a return signal from the device under test comprises a pair of flexible, shielded wire leads which are adapted to be connected between the device under test and the means for amplifying the return signal, with the shielding of said shielded wire leads being grounded to the chassis of the apparatus to absorb electromagnetic or radio frequency interference which may otherwise enter the means for amplifying the return signal.

8. Apparatus in accordance with claim 1, wherein the means for producing the output signal and the means for amplifying the return signal are housed within a metal chassis, and the means for receiving a return signal comprises a pair of flexible, shielded wire leads and a magnetic sensor which is placed in close proximity to the device under test, with the wire leads being connected between the magnetic sensor and the means for amplifying the return signal, and further with the shielding of said shielded wire leads being grounded to the chassis of the apparatus to absorb electromagnetic radio frequency interference which may otherwise enter the means for amplifying the return signal.

9. Apparatus in accordance with claim 8, wherein the magnetic sensor comprises a plurality of turns of insulated wire wound on a magnetic core, or a magnetic flux sensing means, such as a Hall effect device.

10. Apparatus in accordance with claim 1, wherein the means for amplifying said return signal comprises an amplifier power supply and an amplifier, with the amplifier power supply comprising a second full wave bridge rectifier having its A.C. terminals connected to the secondary winding of the stepdown transformer;

a pair of power leads connected from the D.C. terminal of said second rectifier to the amplifier;

a pair of smoothing, filter capacitors connected in parallel between said power leads from said second rectifier;

a voltage regulating device connected between said power leads from said second rectifier; and a metal oxide varistor connected between the A.C. terminals of said second rectifier as a transient protector for said second rectifier.

11. Apparatus is accordance with claim 10, wherein the amplifier comprises a first impedance matching transformer which is adapted to receive the return signal;

an amplifier circuit connected between the first impedance matching transformer and a second impedence matching transformer wherein the amplified return signal is fed to the second impedance matching transformer; and gain control means associated with the amplifier circuit to control the gain of the amplifier circuit.

12. Apparatus in accordance with claim 11, wherein the means for displaying the magnitude of the amplified return signal comprises a microammeter which is connected to the second impedence matching transformer, and means are provided for protecting the microammeter from overvoltages.

* * * * *